United States Patent
Bittmann et al.

(10) Patent No.: US 8,191,243 B2
(45) Date of Patent: Jun. 5, 2012

(54) METHOD FOR MAKING CONTACT WITH A CONTACT SURFACE ON A SUBSTRATE

(75) Inventors: Ladislaus Bittmann, München (DE); Jörg Naundorf, München (DE); Karl Weidner, München (DE); Hans Wulkesch, München (DE)

(73) Assignee: Siemens Aktiengesellschaft, Munich (DE)

( * ) Notice: Subject to any disclaimer, the term of this patent is extended or adjusted under 35 U.S.C. 154(b) by 895 days.

(21) Appl. No.: 12/224,094

(22) PCT Filed: Dec. 20, 2006

(86) PCT No.: PCT/EP2006/070021
§ 371 (c)(1),
(2), (4) Date: Aug. 18, 2008

(87) PCT Pub. No.: WO2007/096017
PCT Pub. Date: Aug. 30, 2007

(65) Prior Publication Data
US 2009/0021923 A1     Jan. 22, 2009

(30) Foreign Application Priority Data

Feb. 20, 2006 (DE) .................. 10 2006 007 795
Mar. 7, 2006 (DE) .................. 10 2006 010 523

(51) Int. Cl.
*H05K 3/36* (2006.01)
(52) U.S. Cl. ............... 29/830; 29/832; 29/846; 29/852; 430/5
(58) Field of Classification Search ............ 29/825, 29/830, 832, 852, 846; 430/5
See application file for complete search history.

(56) References Cited

U.S. PATENT DOCUMENTS

| 5,019,997 | A | | 5/1991 | Haller et al. |
| 5,856,913 | A | | 1/1999 | Heilbronner et al. |
| 5,958,628 | A | * | 9/1999 | Balz et al. ............... 430/5 |
| 6,127,069 | A | * | 10/2000 | Balz et al. ............... 430/5 |
| 6,207,330 | B1 | * | 3/2001 | Balz et al. ............... 430/13 |
| 6,284,564 | B1 | | 9/2001 | Balch et al. |
| 6,306,680 | B1 | | 10/2001 | Fillion et al. |

(Continued)

FOREIGN PATENT DOCUMENTS

DE          4231180          3/1994
(Continued)

*Primary Examiner* — Carl Arbes
(74) *Attorney, Agent, or Firm* — Harness, Dickey & Pierce, P.L.C.

(57) ABSTRACT

In one embodiment of the present invention, a method is disclosed for contacting at least one electric contact surface on a surface of a substrate and/or a surface of a semiconductor chip arranged on a substrate. According to one embodiment of the invention, a film of electrically insulating plastic material is laminated onto the surfaces. A large-area contacting of the contact surfaces, which are freely accessible via the openings in the film, with a layer of electrically conductive material is then carried out. It is the aim of a planar electric contacting method to produce openings in an insulation during a short period of processing time. In particular, openings are to be positioned at a precise position to the contact surfaces. To achieve this, openings are produced in the film of electrically insulating plastic material in the region of the contact surface to be contacted by means of laser cutting and prior to laminating. This method is suitable for all planar contacting processes. Substrates or semiconductor chips which are contacted accordingly may be produced. The semiconductor chips used can be, in particular, power semiconductor chips.

15 Claims, 1 Drawing Sheet

U.S. PATENT DOCUMENTS

| | | |
|---|---|---|
| 7,208,347 B2 | 4/2007 | Seliger et al. |
| 2005/0032347 A1 | 2/2005 | Hase et al. |
| 2006/0192290 A1 | 8/2006 | Seliger et al. |
| 2007/0111475 A1 | 5/2007 | Licht et al. |
| 2007/0200227 A1 | 8/2007 | Licht et al. |
| 2007/0216025 A1 | 9/2007 | Seliger et al. |

FOREIGN PATENT DOCUMENTS

| | | |
|---|---|---|
| DE | 10-2004-039834 | 3/2006 |
| WO | WO 0247151 | 6/2002 |
| WO | WO 2006/052955 | 5/2006 |

\* cited by examiner

METHOD FOR MAKING CONTACT WITH A CONTACT SURFACE ON A SUBSTRATE

PRIORITY STATEMENT

This application is the national phase under 35 U.S.C. §371 of PCT International Application No. PCT/EP2006/070021 which has an International filing date of Dec. 20, 2006, which designated the United States of America and which claims priority on German Patent Application numbers 10 2006 007 795.4 filed Feb. 20, 2006 and 10 2006 010 523.0 filed Mar. 7, 2006, the entire contents of each of which are hereby incorporated herein by reference.

FIELD

At least one embodiment of the present invention generally relates to a method for making contact with at least one electrical contact surface on a surface of a substrate and/or on a surface of a semiconductor chip arranged on the substrate. At least one embodiment relates to a method including laminating a film made of electrically insulating plastic material onto the surface, and making planar contact between the contact surface made openly accessible by holes in the film and a layer of electrically conducting material. At least one embodiment of the invention also generally relates to substrates and/or semiconductor chips with which electrical planar contact has been made in this manner.

BACKGROUND

WO 2003/030247 A2 describes a method for making planar contact with electrical contact surfaces of a substrate, and a device including a substrate having electrical contact surfaces. In the procedure for making contact with electrical contact surfaces on a surface of a substrate, a polyamide-based or epoxy-based film is laminated onto the surface under vacuum, so that the film closely covers the contact surfaces and adheres to this surface, each contact surface for making contact on the surface is exposed by opening respective windows in the film, and planar contact is made between each exposed contact surface and a metal layer. In particular, power semiconductor chips, which need a high current density and have large surface-area contacts, are devices produced in this manner.

This method is used to produce planar electrical contacts, i.e. contacts that extend over a two-dimensional area, with three-dimensional components. Large contact windows in relatively thick insulating materials need to be opened for the required openings in the insulating layers. The thickness of the insulating materials usually lies in the region of 200 μm. The openings in the insulating layers are used in particular for making through-connections to substrate and chip contact-surfaces. Contact windows are conventionally opened by means of laser ablation patterning over the entire surface, with an area of about one cm² conventionally taking about 100 seconds to open. This results in undesirably long processing times and is hence economically disadvantageous in a scheduled fabrication process.

SUMMARY

At least one embodiment of the present invention, in an electrical planar contact-making procedure, provides in a short processing time, contact windows or holes in an insulating material, and, in a particular embodiment, to position extremely accurately these contact windows or holes with respect to contact surfaces of a substrate and/or of an electrical component or semiconductor chip.

At least one embodiment of the present invention improves a time-consuming laser ablation process for creating holes in a film made of electrically insulating plastic material in order to expose electrical contact surfaces of a substrate and/or of a semiconductor chip. Contact windows are opened by way of an advantageous laser cutting process. At least one laser cutting device uses a laser to cut through a film along a line, for example, with the spatial power distribution of the laser being generated with a Gaussian profile for example. This avoids time-consuming planar removal as is entailed in a laser ablation procedure for example.

The linear laser cutting process means that contact holes can be created relatively quickly in the film made of electrically insulating plastic material. Hence the method and the devices produced accordingly can be provided at low cost.

A low-cost patterning method for creating contact holes in the film made of electrical insulating plastic material is provided that has short processing times. Planar material removal does not take place according to at least one embodiment of the present invention, enabling a substantial reduction in the processing times and likewise a reduction or elimination of ablation residues on the contact surfaces. The laser processing times are a substantial cost factor and are hence also a decisive factor in the cost effectiveness of electrical planar contacts. In the procedure for making contact with electrical contact surfaces on a surface of a substrate, a polyamide-based or epoxy-based film is laminated onto the surface under vacuum, so that the film closely covers the surface containing the contact surfaces, and adheres to this surface.

According to an advantageous embodiment, the film holes are created according to the individual position of the contact surfaces or according to the individual position of the semiconductor chips from data measured using an automatic optical inspection process (AOI). The film holes are cut according to the individual position of the components based on the measured AOI data. In the AOI procedure, a high resolution camera is used to find the actual positions of the components, for example semiconductor chips, in the x- and y-directions, and to determine any rotation of the components. An inspection window is used to compare the actual and required positions. The actual positions of contacts or contact surfaces of the components are determined precisely.

According to a further advantageous embodiment, laser cutting is performed with a cutting speed of around 4 cm per second, giving a particularly good ratio of length of cutting time to cutting quality.

According to a further advantageous embodiment, it is particularly advantageous to arrange the holes in the insulating material or in the film extremely accurately with respect to the contact surfaces. Such precise positioning can be performed particularly advantageously after opening the film, i.e. after creating respective holes, and prior to laminating the film onto the substrate or onto the semiconductor chip. Alignment and fixing of the film for precise positioning of the holes relative to the contact surfaces on the surface are performed using geometric shapes. In particular, the patterned films containing holes are aligned relative to the substrate by way of geometric shapes, then fixed and subsequently laminated onto the substrate.

According to a further advantageous embodiment, at least one hole created in the film and having a geometric shape is centered on a pattern created on the substrate and having a matching geometric shape. Centering can be performed by at least one opto-electronic device using suitable alignment patterns. It is advantageous here to make the geometric shape of the created hole the same as the geometric shape of the created pattern, where the holes created in the film and the substrate patterns can be referred to as markers. Centering can be performed by getting symmetry axes and/or symmetry points, or generally axes or points, of the geometric shapes to coincide.

According to further advantageous embodiments, the geometric shapes are crosses, squares or circles. When using crosses, the centers of the axes of film and pattern can be aligned to lie one above the other. When using squares or circles, the outlines can be made to match up. Point-symmetric or axis-symmetric geometric shapes are particularly advantageous.

According to a further advantageous embodiment, the geometric shapes in the film can be created using lasers, in particular by laser cutting. The geometric patterns on the substrate can be created particularly advantageously by etching. The geometric shapes can also be created by plasma etching or mechanical processing techniques, in particular punching.

The scope of protection also includes all substrates and/or semiconductor chips with which electrical planar contact has been made according to one or more of the previous methods.

BRIEF DESCRIPTION OF THE DRAWINGS

The present invention is described in greater detail with reference to example embodiments in conjunction with the figures, in which.

DETAILED DESCRIPTION OF THE EXAMPLE EMBODIMENTS

Figure 1:
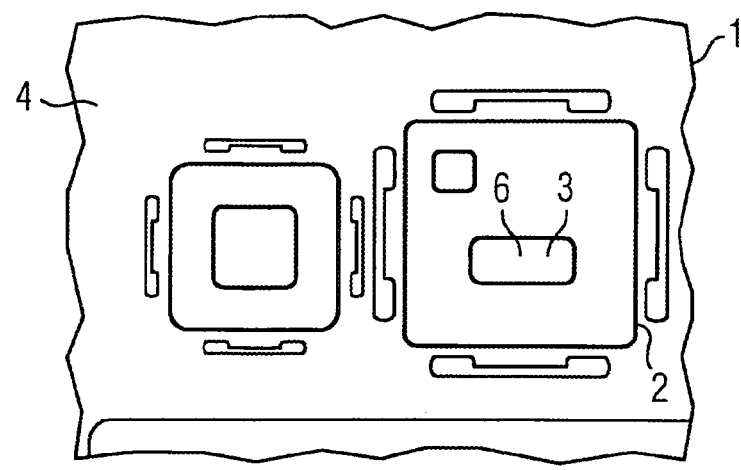
FIG. 1 shows an example embodiment of a device according to the invention.

FIG. 1 shows an example embodiment of a device according to the present invention. Semiconductor chips 2 are arranged on a substrate 1. The contact surfaces 6 of the semiconductor chips 2 exposed by holes 3 in the film are clearly visible. Reference numeral 4 denotes a film. FIG. 1 shows contact holes in a film produced by laser cutting, for example in films known by the trade name TSA 15 having a thickness of 200 μm. Owing to chip positioning tolerances, the positions of the contact holes are measured by automatic optical inspection (AOI) prior to lamination. In an alternative punching process, the individual position of the chips cannot be taken into account.

Figure 2:
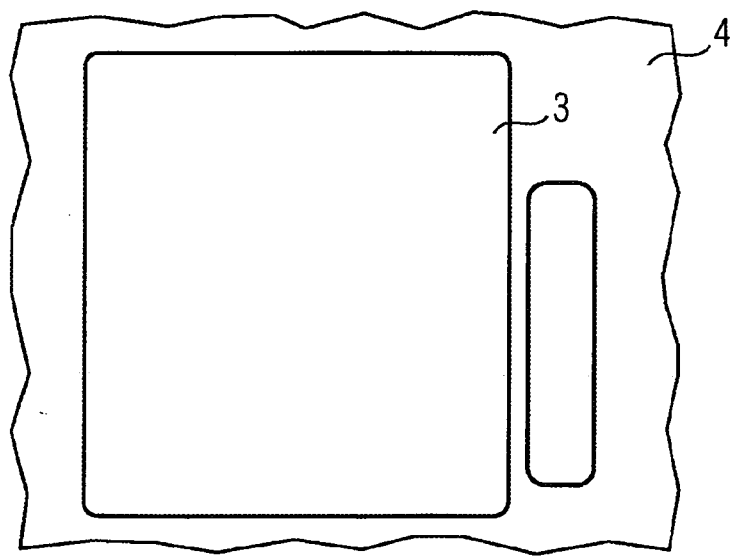
FIG. 2 shows an example embodiment of cut-out contact holes.

FIG. 2 shows an example embodiment of contact holes 3 cut out by laser cutting. The contact holes 3 are the holes 3 in the film 4 for open access to contact surfaces 6 of the substrate 1 and/or the semiconductor chip 2. Reference numeral 3 indicates the contact holes 3, reference numeral 4 the insulating film 4. Like the measured AOI chip positions, the contact holes 3 are cut prior to lamination.

Figure 3:
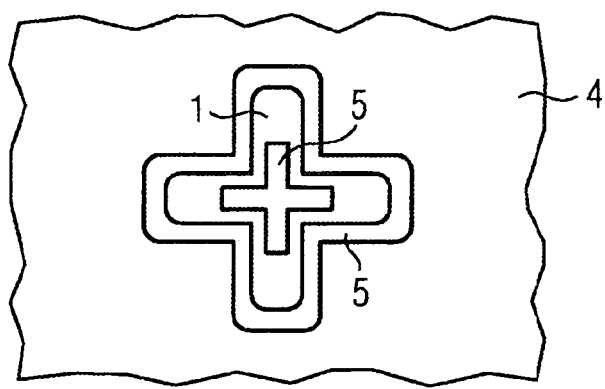
FIG. 3 shows an example embodiment of alignment patterns.

FIG. 3 shows an example embodiment of alignment patterns, or in other words geometric shapes 5. After creating holes 3 in the film 4 and prior to lamination of the film 4, the film 4 is aligned and fixed using geometric shapes 5 in order to position the holes 3 precisely relative to the contact surfaces 6 on the surfaces of the substrate 1 or of the semiconductor chip 2. At least one hole created in the film 4 and having a geometric shape 5 is centered with respect to a pattern created on the substrate 1 and having a matching geometric shape 5.

According to the example embodiment, the geometric shape 5 is a cross. The cross can be created on the substrate 1 by etching, for example. In this example, the geometric shape 5 as a hole in the film 4 is also a cross. This can likewise be created by laser cutting. A copper layer can be seen around the etched cross of the substrate 1.

It is equally possible to form the cross 5 on the substrate 1 as a copper layer that is enclosed by areas of the substrate 1 that have been etched away. The center of the cross 5 of the film 4 is shifted onto the center of the cross 5 of the substrate 1, thereby achieving the centering. It is particularly advantageous to use two such centering points. These can be arranged diagonally with respect to each other for example. Other relative positions are also possible. Centering can be performed manually using a microscope; automatic centering procedures are also possible, for example, using an automatic machine.

FIG. 3 shows alignment patterns, or in other words geometric shapes 5, in the film 4 and in the underlying substrate 1. The film 4 is hence aligned with the substrate 1 via the matching patterns having the geometric shapes 5. A "panel of alignment" procedure is used in particular. It is particularly advantageous when a semiconductor chip 2 is a power semiconductor chip.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. A method for making contact with at least one electrical contact surface on a surface of at least one of a substrate and an electronic component arranged on the substrate, the method comprising:
   laminating a film made of electrically insulating plastic material onto the surface;
   making planar contact between the contact surface made openly accessible by holes in the film and a layer of electrically conducting material; and
   creating by laser cutting, prior to lamination, the holes in the film for making planar contact, in a region of the contact surface.

2. The method as claimed in claim 1, wherein the film holes are created according to the individual position of the contact surfaces from data measured using automatic optical inspection.

3. The method as claimed in claim 1, wherein laser cutting is performed with a cutting speed of around 4 cm/s.

4. The method as claimed in claim 1, wherein after opening and prior to lamination, alignment and fixing of the film for precise positioning of the holes relative to the contact surfaces on the surfaces are performed using geometric shapes.

5. The method as claimed in claim 4, wherein at least one hole created in the film, having a geometric shape, is centered on a pattern created on the substrate and having a matching geometric shape.

6. The method as claimed in claim 4, wherein the geometric shapes are crosses, squares or circles.

7. The method as claimed in claim 4, wherein the geometric shapes are created using lasers.

8. A device, said device being at least one of a substrate and an electronic component, with which electrical planar contact has been made according to the method of claim 1.

9. The device as claimed in claim 8, wherein the electronic component is at least one of a semiconductor chip, a power semiconductor chip, an LED chip, a surface mounted device and a passive component.

10. The method as claimed in claim 2, wherein laser cutting is performed with a cutting speed of around 4 cm/s.

11. The method as claimed in claim 2, wherein after opening and prior to lamination, alignment and fixing of the film for precise positioning of the holes relative to the contact surfaces on the surfaces are performed using geometric shapes.

12. The method as claimed in claim 5, wherein the geometric shapes are crosses, squares or circles.

13. The method as claimed in claim 7, wherein the creating by laser cutting includes,
    at least one of laser cutting, etching and punching the geometric shapes.

14. The method as claimed in claim 5, wherein the geometric shapes are created using lasers.

15. The method as claimed in claim 14, wherein the creating by laser cutting includes,
    at least one of laser cutting, etching and punching the geometric shapes.

* * * * *